(12) United States Patent
Anderson

(10) Patent No.: US 7,159,196 B2
(45) Date of Patent: Jan. 2, 2007

(54) SYSTEM AND METHOD FOR PROVIDING INTERFACE COMPATIBILITY BETWEEN TWO HIERARCHICAL COLLECTIONS OF IC DESIGN OBJECTS

(75) Inventor: David Michael Anderson, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 364 days.

(21) Appl. No.: 10/771,964

(22) Filed: Feb. 4, 2004

(65) Prior Publication Data
US 2005/0172245 A1 Aug. 4, 2005

(51) Int. Cl.
*G06F 17/50* (2006.01)
(52) U.S. Cl. .............................. 716/3; 703/14; 703/15; 703/16
(58) Field of Classification Search .................... 716/3; 703/14–16
See application file for complete search history.

(56) References Cited
U.S. PATENT DOCUMENTS

| | | | |
|---|---|---|---|
| 4,963,768 A * | 10/1990 | Agrawal et al. | 326/38 |
| 5,015,884 A * | 5/1991 | Agrawal et al. | 326/39 |
| 5,128,871 A * | 7/1992 | Schmitz | 716/17 |
| 6,009,251 A | 12/1999 | Ho et al. | |
| 6,470,477 B1 | 10/2002 | Scott | |
| 6,553,554 B1 | 4/2003 | Dahl et al. | |
| 6,557,153 B1 | 4/2003 | Dahl et al. | |
| 6,564,363 B1 | 5/2003 | Dahl et al. | |
| 6,564,364 B1 | 5/2003 | Dahl et al. | |
| 2002/0049956 A1 | 4/2002 | Bozkus et al. | |
| 2002/0053063 A1 | 5/2002 | Bhattacharya et al. | |
| 2002/0124232 A1 | 9/2002 | Grood | |
| 2002/0165701 A1 * | 11/2002 | Lichtenberg et al. | 703/7 |

\* cited by examiner

*Primary Examiner*—Thuan Do
*Assistant Examiner*—Naum Levin

(57) ABSTRACT

A system and method for providing interface compatibility between two hierarchical collections of integrated circuit (IC) design objects. Upon establishing an associative correspondence between a design object from a first hierarchical collection and a design object from a second hierarchical collection, a port compatibility map is generated based on determination that a particular associative correspondence includes a pair of design objects, one from each hierarchical collection, that are port-compatible. Thereafter, the port compatibility map is reduced to determine a set of design object pairs that allow interface-compatible replaceability between the first and second hierarchical collections.

28 Claims, 9 Drawing Sheets

SYSTEM AND METHOD FOR PROVIDING INTERFACE COMPATIBILITY BETWEEN TWO HIERARCHICAL COLLECTIONS OF IC DESIGN OBJECTS

BACKGROUND

Many integrated circuit (IC) devices, e.g., application specific integrated circuits (ASICs) or other custom IC devices, are designed and fabricated using a number of various computer-implemented automatic design processes. Within these processes, a high level design language description of the integrated circuit (e.g., using HDL, VHDL, Verilog, etc.) is first translated by a computer system into a netlist of generic logic. The generic logic can then be translated into a netlist of technology-specific gates and interconnections therebetween that represent the IC design. The netlist is, more specifically, a listing of circuit elements and their connectivity information and is stored within computer memory (as part of a design database environment) of the computer system.

To reduce costs and time to market, circuit designers have developed design libraries which contain numerous standard design objects grouped by specific function, along with known electrical operating characteristics and parametric values including, for example, resistance and capacitance. Standard cell libraries are illustrative of design libraries that contain commonly used medium-scale integration (MSI) structures such as decoders, registers, and counters and commonly used large-scale integration (LSI) structures such as memories, programmable logic arrays, and microprocessors. The circuit designer utilizes the standard cells and custom cells to design and optimize the layout of a circuit by, for example, reducing propagation delays and minimizing the size of the chip to increase the number of chips which can be fabricated on a single wafer.

It is advantageous sometimes to replace an existing design object (i.e., a cell or a subcircuit) in a particular IC design by another design object for a number of reasons (e.g., the circuit represented by the replacement design object is faster, consumes less power, more immune to noise, et cetera). Replacing design objects in an IC design is rather complicated, however, especially where the design object to be replaced is provided as part of a hierarchical design netlist. Further, if the subcircuit represented by the design object is used at multiple locations within the overall IC design, it is necessary that the replacement subcircuit has a signal interface that is compatible throughout the hierarchy.

SUMMARY

In one embodiment, a scheme is disclosed for providing interface compatibility between two hierarchical collections of IC design objects. Upon establishing an associative correspondence between a design object from a first hierarchical collection and a design object from a second hierarchical collection, a port compatibility map is generated based on determination that a particular associative correspondence includes a pair of design objects, one from each hierarchical collection, that are port-compatible. Thereafter, the port compatibility map is reduced to determine a set of design object pairs that allow interface-compatible replaceability or exchangeability between the first and second hierarchical collections.

DETAILED DESCRIPTION OF THE DRAWINGS

Figure 1:
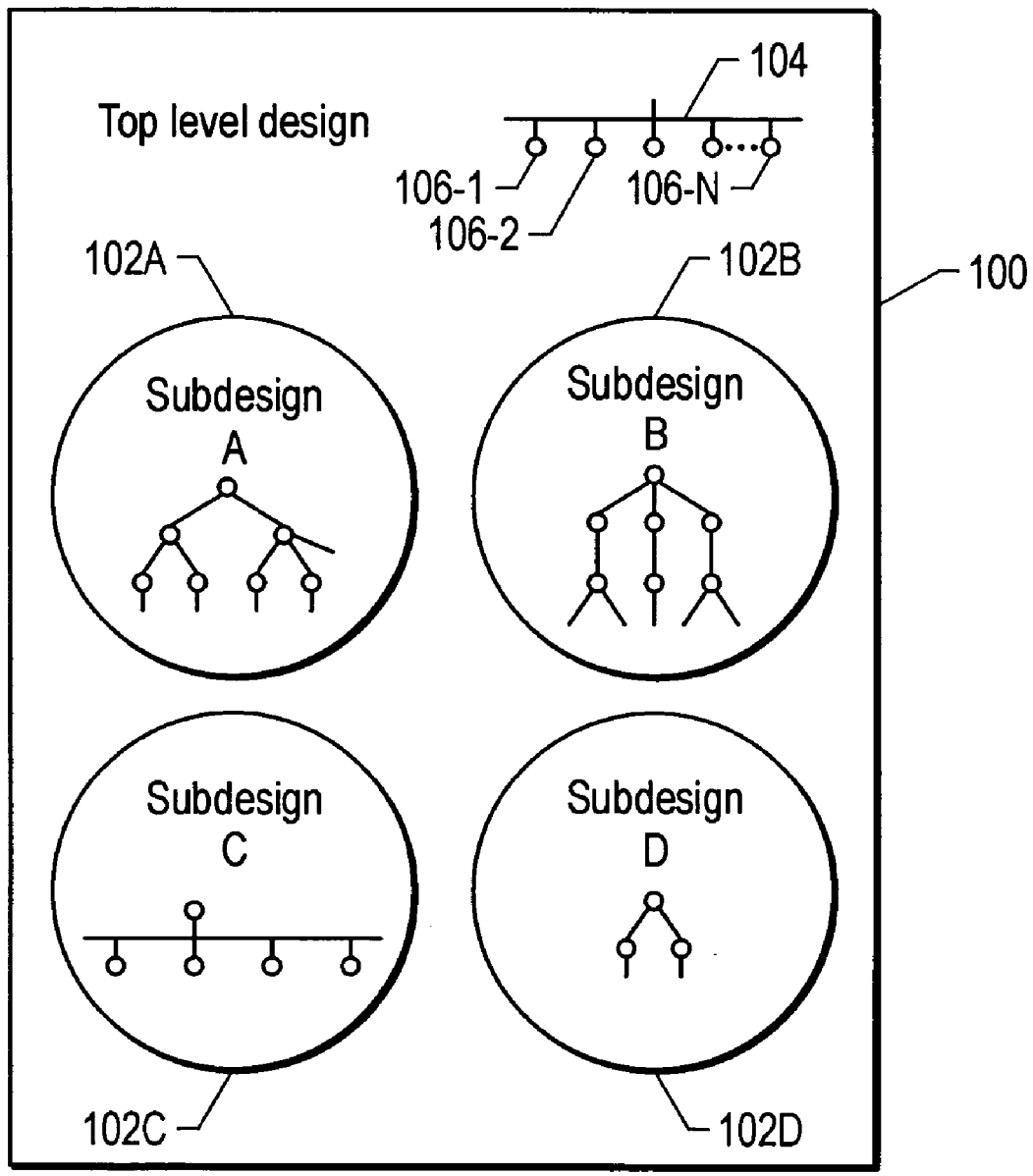
FIG. 1 depicts an embodiment of a top level design relating to an IC device.

In the drawings, like or similar elements are designated with identical reference numerals throughout the several views thereof, and the various elements depicted are not necessarily drawn to scale. Referring now to FIG. 1, therein is depicted an embodiment of a top level design 100 relating to an IC device or at least a portion thereof. As is well-known, the top level IC design 100 may be provided as a computer-implemented multi-file database structure having a hierarchical netlist organization wherein one or more subdesigns contain design objects that are interfaced together in parent-child relationships including tertiary or other higher-level nesting. Further, the top level design 100 may also include subdesigns with a flattened connectivity architecture as well as local leaf cells directly used by the top level design 100.

For purposes of the present patent application, the top level design 100 may relate to any type of design library including, for example, standard cell libraries, custom design libraries, hybrid design libraries, et cetera, and the various entities having prescribed interface relationships therein will be referred to as design objects regardless of their hierarchical level. Reference numeral 102A refers to a hierarchical design object, Subdesign A, that includes a plurality of lower level design objects. Likewise, each of Subdesign B 102B, Subdesign C 102C and Subdesign D 102D comprises a hierarchical design object that in turn includes additional lower level design objects which may be arranged in a tree fashion depending on the interfacing relationships imposed thereon. Reference numeral 104 refers to a number of local design objects 106-1 through 106-N of the top level design 100 that are disposed in a flat connectivity architecture.

Under the hierarchical representation set forth above, a design object may have one parent design and can include one or more child designs, wherein each design is provided with its own specific input/output (I/O) interfaces. All the design objects, from the top level design to the leaf cells located at the bottom of the hierarchy, include level-specific design data (e.g., geometry and connectivity) that is used in the design of a particular IC device.

Figure 2:
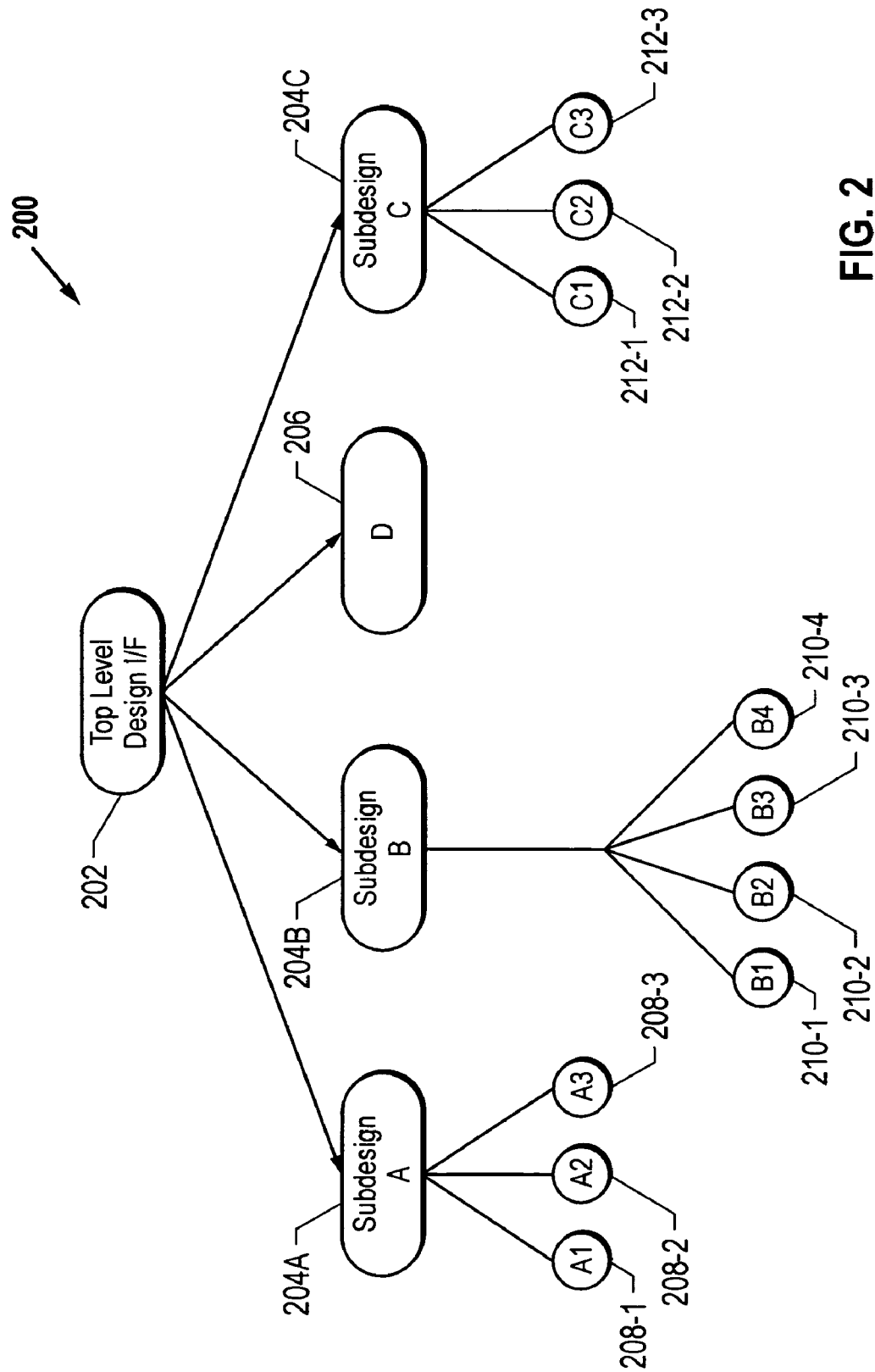
FIG. 2 depicts an embodiment of a hierarchical collection of design objects with respect to a design.

FIG. 2 depicts an embodiment of a hierarchical netlist 200 of a collection of design objects with respect to a design, such as, e.g., the top level design 100 described above. The netlist 200 represents a hierarchical tree organization of geometric information and connectivity information regarding the various design objects, wherein each design object has a specific I/O signal interface relationship. A top level circuit design netlist 202 contains references to Subdesign A 204A through Subdesign C 204C as well as Subdesign D 206. By so referencing, the top level circuit design includes all geometry and connectivity information contained within each Subdesign. By way of illustration, Subdesign A 204A contains three leaf objects A1 208-1 through A3 208-3. Subdesign B 204B contains four leaf objects B1 210-1 through B4 210-4. Likewise, Subdesign C 204C contains reference to three leaf objects C1 212-1 through C3 212-3. Each Subdesign as well as the top level circuit design can also include local geometry and interconnections (i.e., design structure) that represent circuitry logically situated within a Subdesign or the top level circuit design. It should be appreciated that each parent level design object (e.g., the top level circuit design 202 or any of the Subdesigns A through C) that references other child level design objects also contains connectivity information regarding the manner in which the child objects are interconnected together.

As alluded to hereinabove, each of the design objects is provided with its own I/O signal interface and, accordingly, when a design object needs to be exchanged or replaced with another design object (from a different design library or from another portion of the same library) for any reason, interface compatibility must be ensured regardless of its hierarchical level.

FIGS. 3A–3C and 4A–4C depict two sample hierarchical circuit interface collections between which a set of design objects having interface compatibility is determined according to an embodiment of the invention. As will be seen below, the methodology for ensuring interface compatibility between two hierarchical collections involves generating a port compatibility map that is a subset of the design objects common to both collections and then reducing that port compatibility map to determine a set of design objects (i.e., a maximal set) that can be safely exchanged without running into any potential conflict. These teachings will be explained in detail using the circuit interface collections of FIGS. 3A–3C and 4A–4C as one illustrative example.

Figure 3A:
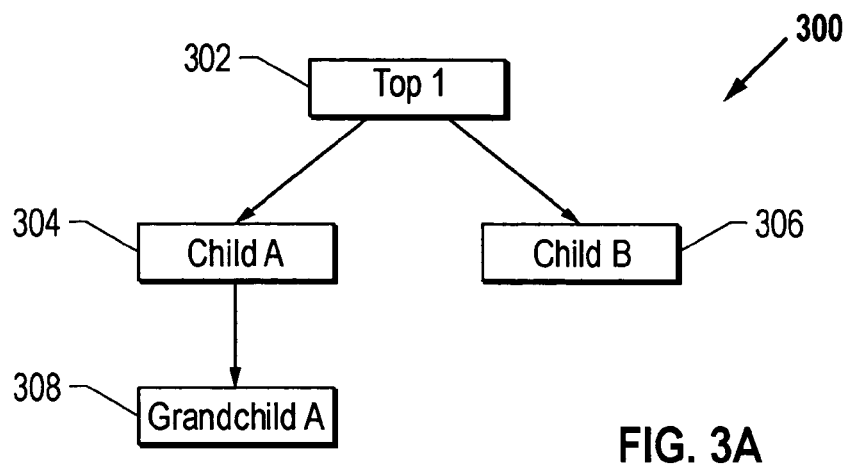
FIGS. 3A–3C and 4A–4C depict an example of two hierarchical circuit interface collections between which a set of design objects having interface compatibility is determined.
Figure 3B:
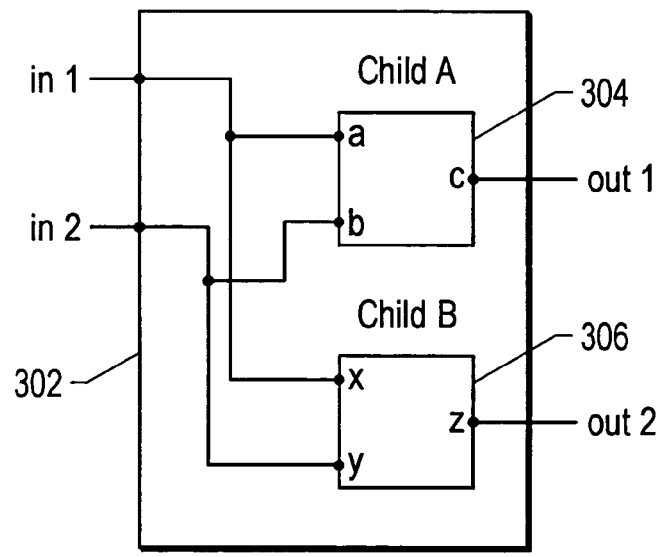
Figure 3C:
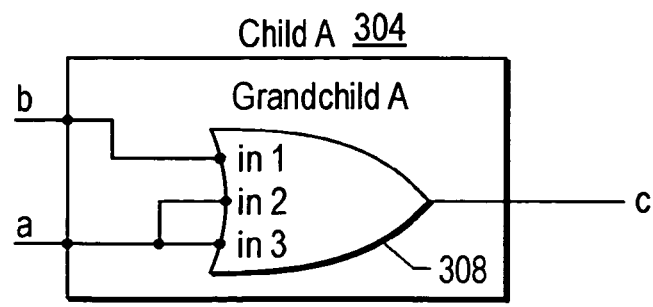

Referring now in particular to FIG. 3A, a first sample hierarchical collection 300 includes a top level design object Top 1 302, which references two child level design objects, Child A 304 and Child B 306. Child A 304 further includes a Grandchild A 308. FIG. 3B depicts these design objects in a design space schematic representation including the signal interfaces associated therewith. Top 1 302 is provided with the following illustrative I/O signal interfaces, also referred to as its port list: {in 1, in 2, out 1, and out 2}. Likewise, the port lists for Child A 304 and Child B 306 comprise {a, b, and c} and {x, y, and z}, respectively. FIG. 3C depicts the gate level representation of Grandchild A 308 whose port list comprises {in 1, in 2, and in 3}, wherein signal a is coupled to in 2 and in 3 and signal b is coupled to in 1. The OR output of Grandchild A 308 is coupled to signal c.

Based on the hierarchical relationships described above, it can be seen that a design object may use another design object, be used by another design object, or simply operate as a leaf level design object that does not use other design objects. Use conditions as well as the port lists associated with the design objects describe what may be referred to as a multi-dimensional attribute space relating to a hierarchical collection that needs to be analyzed before a determination can be made that a particular design object of the collection may be safely exchanged or replaced with another design object. The attributes associated with the hierarchical collection 300 may be summarized in a table as below:

TABLE I

| Design Object | Port List | Uses | Used by |
| --- | --- | --- | --- |
| Top 1 | {in 1, in 2, out 1, out 2} | Child A and Child B | None |
| Child A | {a, b, c} | Grandchild A | Top 1 |
| Child B | {x, y, z} | Nothing | Top 1 |
| Grandchild A | {in 1, in 2, in 3} | Nothing | Child A |

Figure 4A:
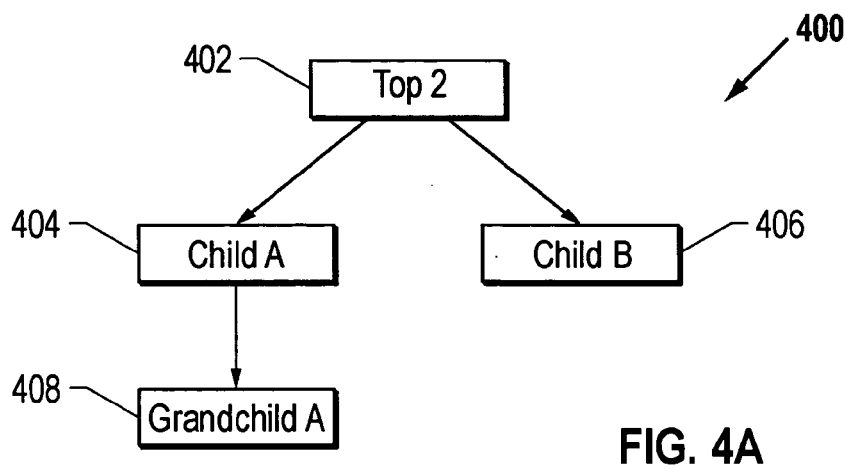
Figure 4B:
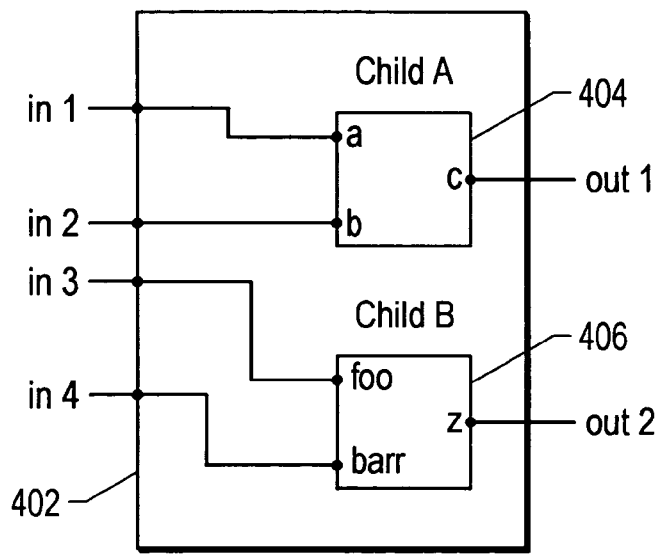
Figure 4C:
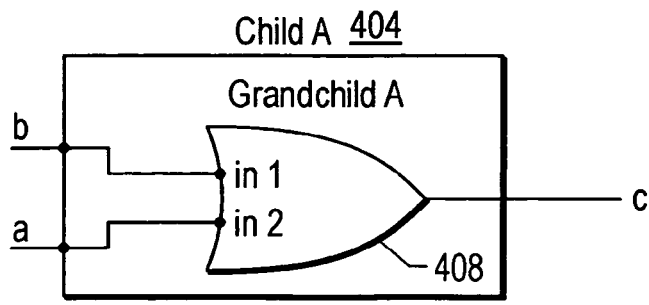

FIG. 4A depicts a second sample hierarchical collection 400 includes a top level design object Top 2 402, which references two child level design objects, Child A 404 and Child B 406. Similar to the first hierarchical collection 300 described above, Child A 404 further includes a Grandchild A 408. As shown in FIG. 4B, however, the signal interfacing relationships among the constituent design objects are different. Top 2 402 is provided with six I/O signals, giving rise to the following port list: {in 1, in 2, in 3, in 4, out 1, and out 2}. The port lists for Child A 404 and Child B 406 comprise {a, b, and c} and {foo, barr, and z}, respectively. FIG. 4C depicts the gate level representation of Grandchild A 408 whose port list comprises {in 1 and in 2}, wherein signal a is coupled to in 2 and signal b is coupled to in 1. The OR output of Grandchild A 408 is coupled to signal c.

The attribute space associated with the hierarchical collection 400 may be summarized in a table as below:

TABLE II

| Design Object | Port List | Uses | Used by |
| --- | --- | --- | --- |
| Top 2 | {in 1, in 2, in 3, in 4, out 1, out 2} | Child A and Child B | None |
| Child A | {a, b, c} | Grandchild A | Top 2 |
| Child B | {foo, barr, z} | Nothing | Top 2 |
| Grandchild A | {in 1, in 2} | Nothing | Child A |

In one embodiment of the methodology for resolving which design objects are exchangeable or replaceable (i.e., their respective circuit interfaces are compatible) between two collections, the design objects (such as, e.g., cells and sub-cells) that are common to the collections are first listed. With respect to the two hierarchical collections 300 and 400 described in the foregoing, the common object space is comprised of: {Child A, Child B, Grandchild A}. Thereafter, a subset of the common design object space is determined which includes the design objects that are port-compatible. In one implementation, port compatibility may be determined based on whether two design objects have the same port list. In the present example, Child A 304 from the collection 300 is port-compatible with its counterpart Child A 404 in the collection 400 as they both have the same port list: {a, b, c}. On the other hand, Child B 306 and Child B 406 are not port-compatible because their respective port lists are different. Since the ports have different names, if an attempt were made to replace Child B from one collection with Child B from the other collection, there is uncertainty as to which ports to connect the signals {in 1} and {in 2} in the specific order as required. Accordingly, the replacement of Child B 306 with Child B 406 (and vice versa) would fail.

Continuing with the last pair of the common design objects, i.e., Grandchild A 308 from the collection 300 and Grandchild A 408 from the collection 400, it should be apparent that they are not port compatible because of the different number of ports. A port compatibility group map may then be constructed whose elements are Boolean values for each of the common design objects that collectively define a design object space of potentially exchangeable objects. For the common design object space defined by {Child A, Child B, Grandchild A}, portCompatibleMap {Child A|true; Child B|false; Grandchild A|false} represents a group of design objects whose Boolean values indicate whether there is a degree of interface compatibility. As will be seen hereinbelow, although there may be design objects in a portCompatibleMap whose Boolean values are true, exchanging them might cause conflicts because of their respective hierarchical level attributes. In other words, while a design object {P} may be deemed to be compatible with another object {P'} based on the port list, exchanging or replacing {P} with {P'} may in fact give rise to connectivity conflicts depending on their respective hierarchical locations as well as respective use attributes associated therewith.

Continuing further with the present example, it is worth noting that if Child A 304 in the collection 300 is replaced by Child A 404 in the collection 400, there is no longer any need for Grandchild A 308 since the only user of that design is Child A 304, which is now replaced with Child A 404 (and Child A 404 uses Grandchild A 408 from the collection 400). To account for this condition, another map, called compatibleMap, is constructed which is initially the same as the portCompatibleMap described above. Thereafter, entries of the compatibleMap are pruned based on the following logic:

```
for (each design object in compatibleMap that is false)
{
    if (all users of that design object are
            portCompatible)
        remove the design object from compatibleMap
}
```

In the present example, Grandchild A will be pruned from compatibleMap because all users of that design, i.e., Child A, are port-compatible (i.e., the Boolean value of Child A is "true" in the portCompatibleMap). After pruning, the compatibleMap becomes: {Child A|true; Child B|false}. If a false entry in the compatibleMap cannot be pruned, then all users of that design (i.e., parents of the design) are incompatible and using them would cause conflicts. Accordingly, another procedure called falsifyParents{ } is provided as exemplified below:

```
for (each design object in compatibleMap that is false)
{
    for (each user of the design object)
        compatibleMap [user] = false
}
```

In the present example, the users of Child B are Top 1 302 and Top 2 402, which are not common to both collections. Therefore, there are no entries to falsify, thereby leaving an irreducible compatibleMap structure having a maximal number of entries whose Boolean values indicate exchangeability or replaceability. Since the compatibleMap has become {Child A|true; Child B|false} after pruning, only Child A is exchangeable between the two collections.

Figure 5A:
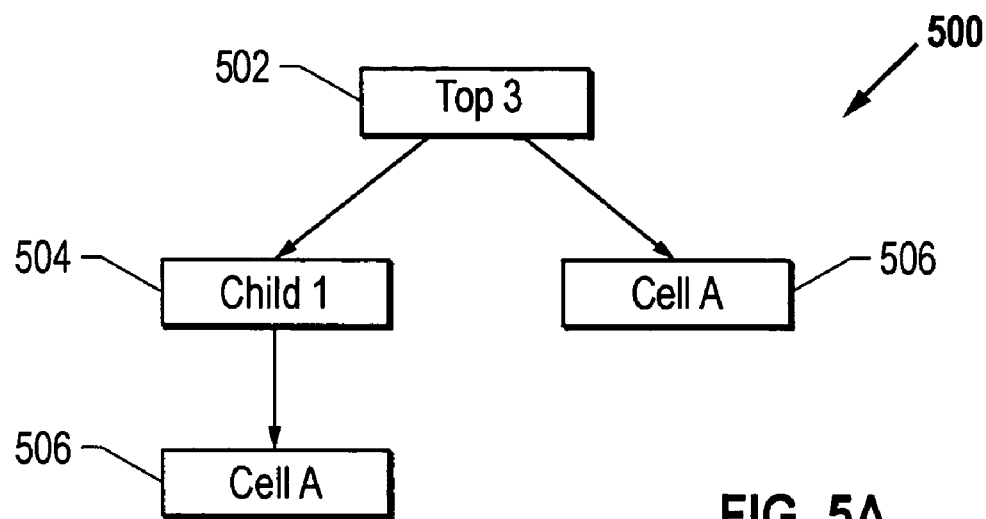
FIGS. 5A–5B and 6A–6B depict an example of two hierarchical circuit interface collections between which a set of design objects having interface compatibility is determined.
Figure 5B:
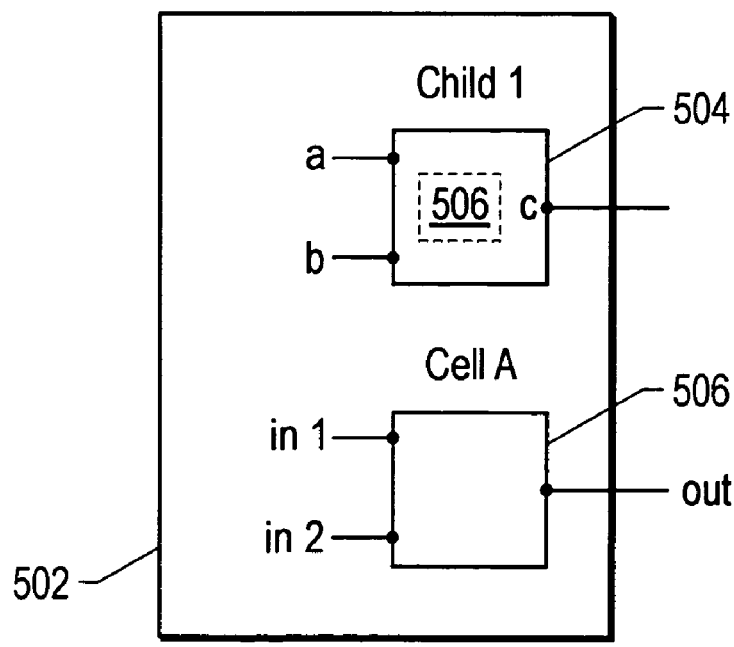

FIGS. 5A–5B and 6A–6B depict a second example of two hierarchical circuit interface collections between which a maximal set of design objects having interface compatibility is determined in accordance with a further embodiment of the invention. Hierarchical collection 500 includes a top level design object Top 3 502 that further references Child 1 504 as well as a leaf object, Cell A 506. Further, configuration of the collection 500 is such that Cell A 506 is also used by Child 1 504. As shown in FIG. 5B, Child 1 504 has a port list: {a, b, c}. Cell A 506 is provided with the port list {in 1, in2, out}. The following table summarizes the attributes of the relevant design objects:

TABLE III

| Design Object | Port List | Uses | Used by |
| --- | --- | --- | --- |
| Child 1 | {a, b, c} | Cell A | Top 3 |
| Cell A | {in 1, in 2, out} | Nothing | Child 1 |

Figure 6A:
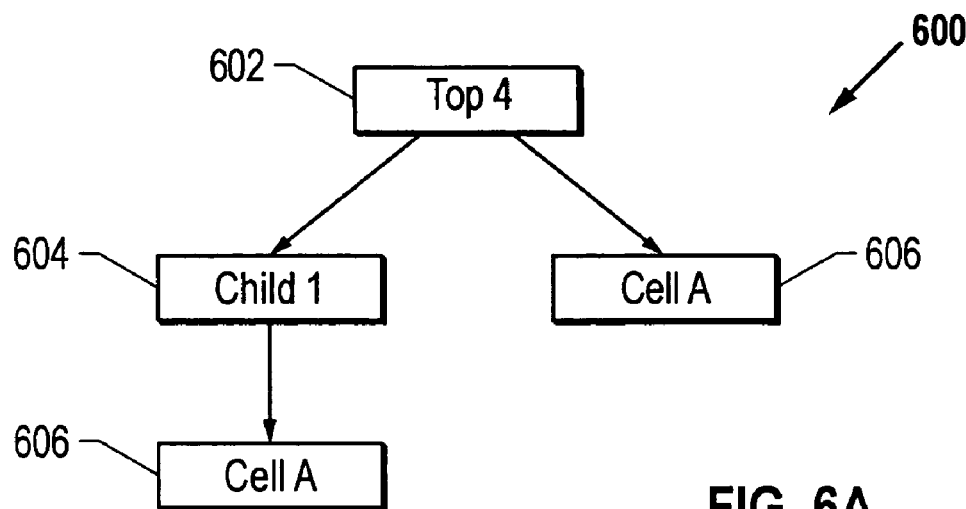
Figure 6B:
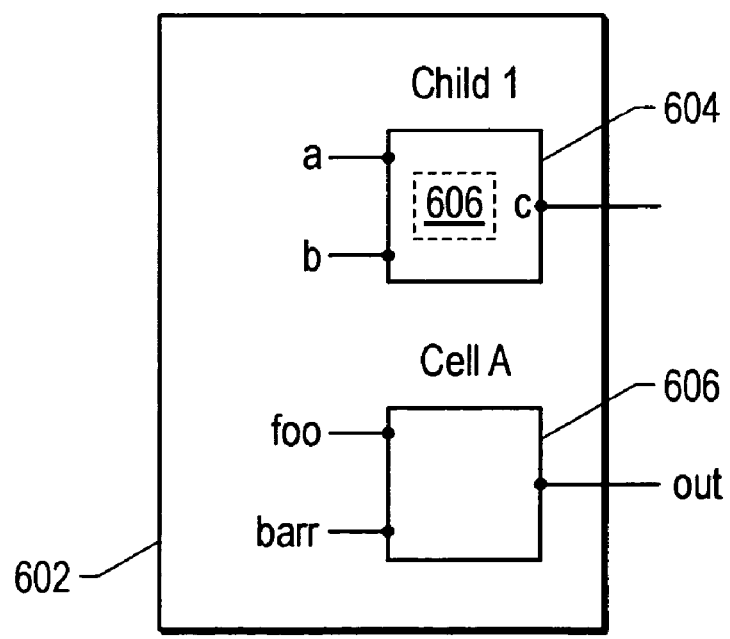

The hierarchical collection 600 shown in FIG. 6A has a similar configuration in that a top level design object Top 4 602 references Child 1 604 as well as a leaf object, Cell A 606 that is also used by Child 1. As shown in FIG. 6B, Child 1 604 has the same port list as Child 1 504, i.e., {a, b, c}. However, the port list of Cell A 606 is provided as {foo, barr, out}. The attributes of the relevant design objects are provided below.

TABLE IV

| Design Object | Port List | Uses | Used by |
| --- | --- | --- | --- |
| Child 1 | {a, b, c} | Cell A | Top 4 |
| Cell A | {foo, barr, out} | Nothing | Child 1 |

The portCompatibleMap for this example would be: {Child 1|true; Cell A|false}. Cell A cannot be pruned because it is used by the objects {Child 1, Top 3, Top 4} and not all users are in the portCompatibleMap (only Child 1 is in it). Therefore, the initial state of the compatibleMap in this case remains the same, i.e., {Child 1|true; Cell A|false}. The falsification procedure is then applied as follows. Users of Cell A include {Child 1, Top 3, Top 4}, of which only Child 1 is in the compatibleMap (i.e., the Boolean value of Child 1 is "true"). Therefore, Child 1 is falsified, i.e., its Boolean value is changed to "false" thereby resulting in the following state for the compatibleMap: {Child 1|false; Cell A|false}. In other words, replacing Child 1 504 in the collection 500 with Child 1 604 in the collection 600 would require the use of Cell A 606 from the collection 600, which cannot be used by Top 3 502.

It should be appreciated that by falsification of parents, additional false entries show up in the compatibleMap. Thus, if all the grandparents of each new false parent are compatible (i.e., their Boolean values in the portCompatibleMap are "true"), they can be pruned as well. Accordingly, an overall iterative process may be implemented:

```
do
{
    PruneNodes[ ];
    FalsifyParents[ ];
} while (at least one parent was changed from true
    to false)
```

As a consequence, each time a child invalidates a parent, the iterative process must continue. Eventually, the process will exhaust all parent objects to falsify, thereby terminating the repetitive loop process. The resulting compatibleMap then includes a set of entries that are compatible (as indicated by "true" Boolean values) between the two collections regardless of their hierarchical locations and use attributes. An embodiment of the overall methodology is provided below:

```
// construct portCompatibleMap;
for ( each cell in both collections )
{
portCompatibleMap [ cell ] = PortCompatible ( cell from collectionA, cell from collectionB )
}
compatibleMap = portCompatibleMap;
do
{
  PruneNodes ( compatibleMap );
    bool atLeastOneParentWasChangedFromTrueToFalse =
FalsifyParents ( compatibleMap );
} while ( atLeastOnePatentWasChangedFromTrueToFalse );
PruneNode ( compatibleMap ) is defined as:
{
  for ( each cell in compatibleMap that is false )
  {
    if ( all users of this cell are portCompatible )
      remove the entry from the compatibleMap
  }
}
FalsifyParents ( compatibleMap ) is defined as:
{
  bool parentChanged = false;
  for ( each cell in compatibleMap that is false )
  {
    for ( each user of cell )
      if ( user is in compatibleMap and compatibleMap ( user ) = = true
)
      {
        compatibleMap ( user ) = false;
        parentChanged = true;
      }
  }
  return parentChanged;
}
```

Figure 7:
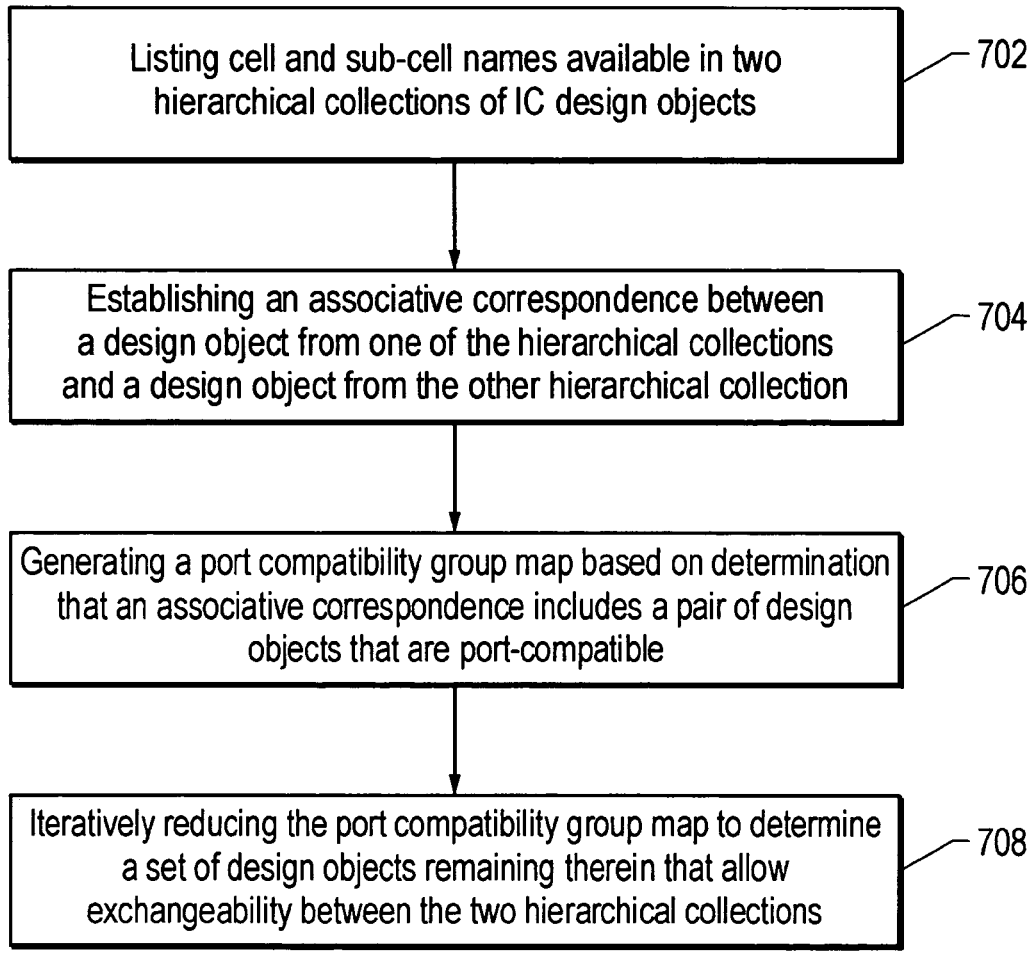
FIGS. 7 and 8 depict a flow chart of a method for providing interface compatibility between two hierarchical collections in accordance with an embodiment of the invention.
Figure 8:
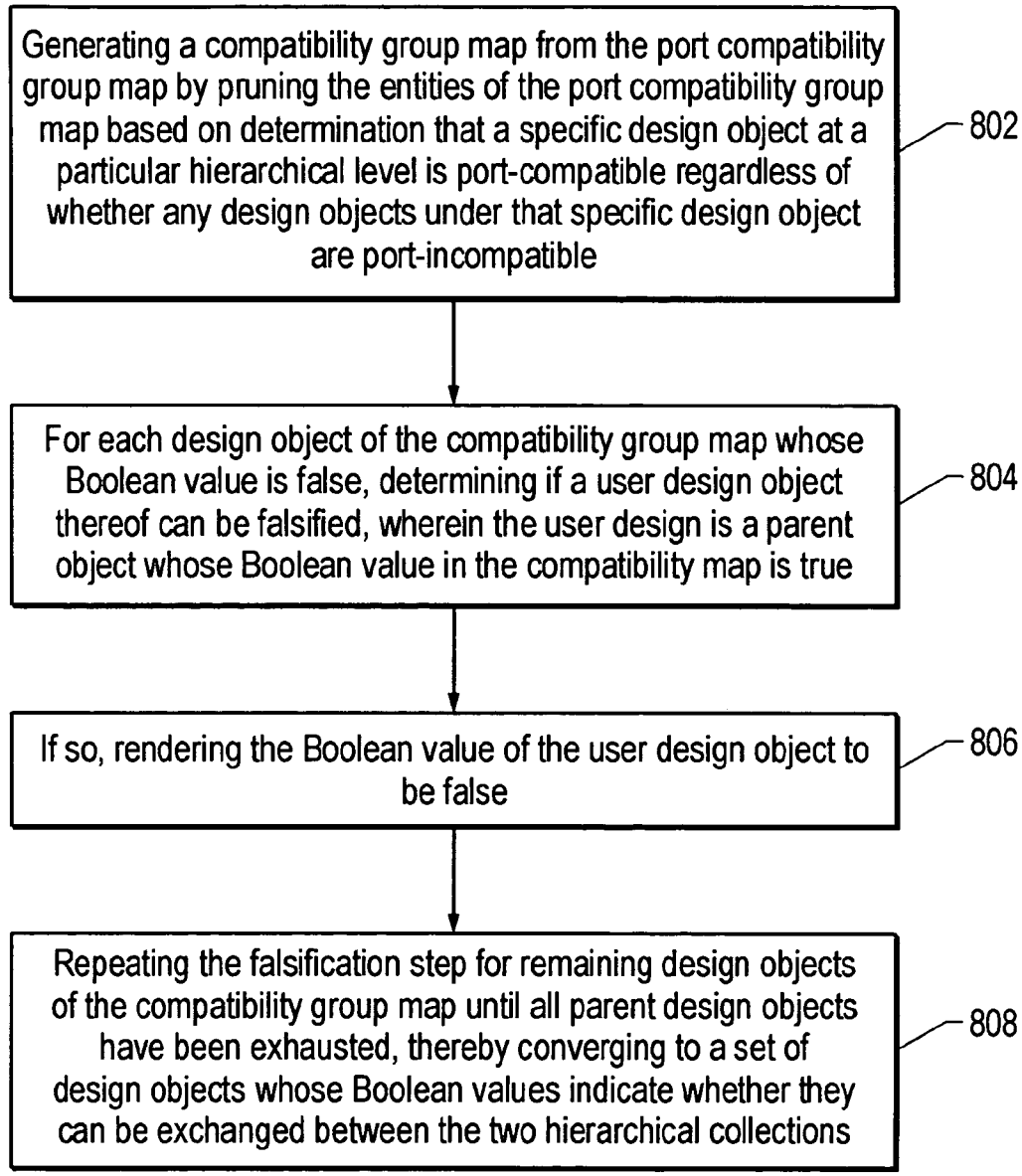

Those skilled in the art will recognize that the term "cell" in the embodiment set forth above is equivalent to "design object" as described herein. Furthermore, the determination of whether a pair of design objects taken from two collections are port-compatible may be effectuated in a number of ways dependent on implementation. FIGS. 7 and 8 depict a method for providing interface compatibility between two hierarchical collections in accordance with an embodiment of the invention. Design objects (i.e., cells and sub-cells) from the two hierarchical collections are listed (block 702), whereupon an associative correspondence between a design object from one collection an equivalent design object from the other collection may be established, e.g., by pairing up cells and sub-cells based on their respective names (block 704). A port compatibility group map is then generated based on determining that an associative correspondence includes a pair of design objects that are port-compatible (block 706). As alluded to earlier, the process for effectuating the determination that a pair of design objects are port-compatible is implementation-specific. For example, the determination process may be automatically effectuated by comparing signal names of the design objects. Or, the design objects may be deemed to be port-compatible by establishing some sort of semantic equivalency, electrical design equivalency or signal functional equivalency therebetween. In yet another variation, port compatibility may be determined manually, e.g., by comparing the I/O signal interfaces of the design objects and forcing equivalence. Upon determining the entries of the port compatibility group map, it is iteratively reduced to an irreducible subset that determines a set of design objects (i.e., a maximal set) that allow exchangeability/replaceability between the two hierarchical collections while ensuring that there is a high degree of signal interface compliance (block 708).

An embodiment of the iterative reduction process is particularly depicted in the flow chart of FIG. 8. A compatibility group map is generated based on the port compatibility group map by pruning, if necessary (block 802). As explained hereinabove, a design object entity of the port compatibility group map may be pruned based on the determination that the design object entity is port-compatible regardless of whether any design objects under that specific design object entity (i.e., any design objects used by the specific design object entity) are not compatible. For each design object of the compatibility group map whose Boolean value is false, a determination is made if a user design object thereof can be falsified (i.e., falsification procedure), wherein the user design object is a parent object whose Boolean value in the compatibility map is true (block 804). If so, the Boolean value of the user design object is rendered to be false (block 806). Thereafter, the parent falsification step is repeated for the remaining design objects of the compatibility group map until all parent design objects have been exhausted, thereby converging to a maximal set of design objects whose Boolean values indicate whether they can be exchanged/replaced between the two hierarchical collections (block 808).

Figure 9:
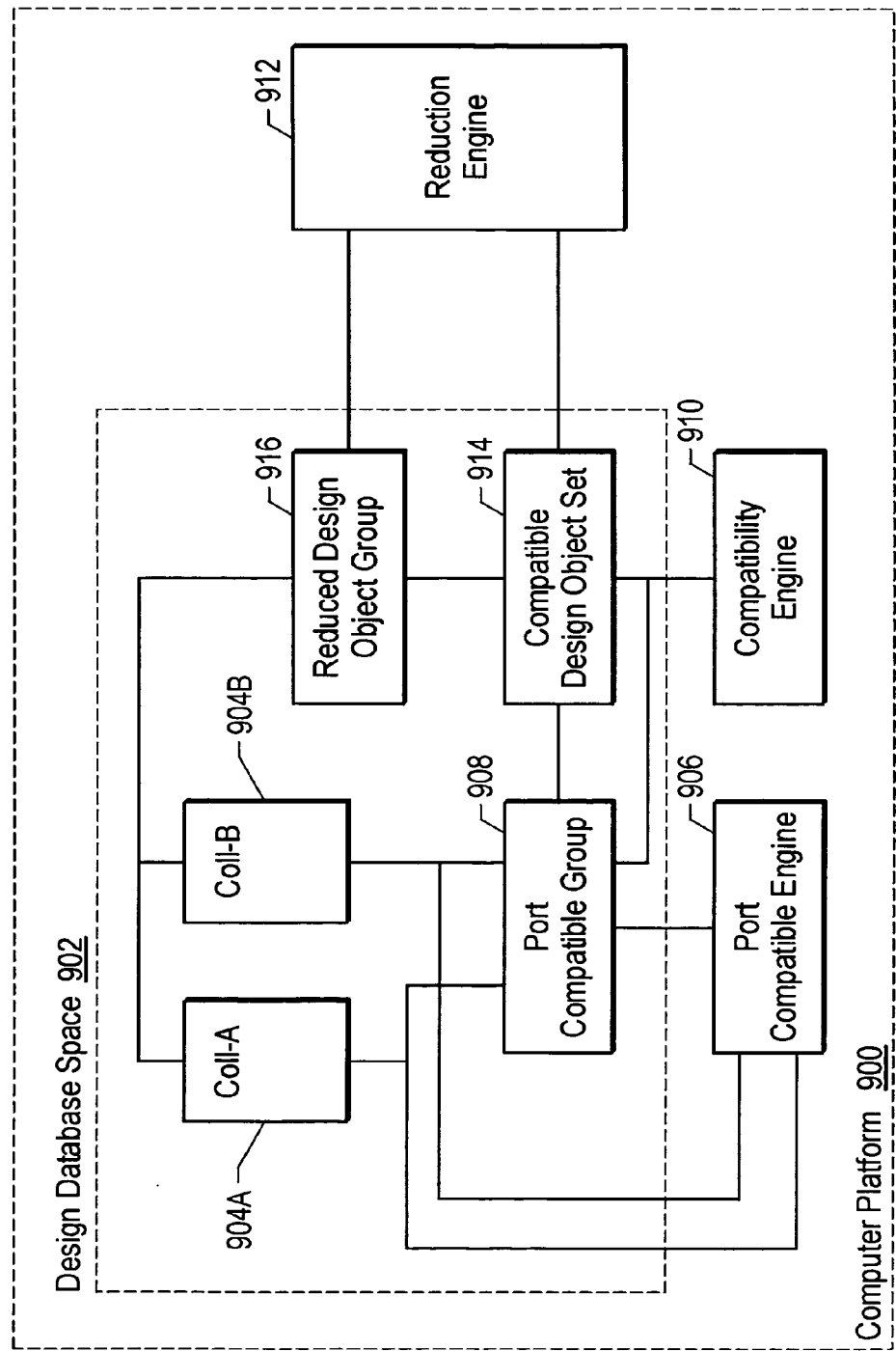
FIG. 9 depicts an embodiment of a computer-implemented system for providing interface compatibility between two hierarchical collections.

FIG. 9 depicts an embodiment of a computer-implemented system supported by a suitable computer platform 900 for ensuring interface compatibility between two hierarchical collections. For purposes of brevity, standard features of the computer platform 900 (such as, e.g., display devices, man-machine interfaces, printer and other output devices, mass storage subsystems, internal processor-memory subsystems, et cetera) are not shown in this rendition. An IC chip design database space 902 supported by the computer platform 900 includes a first collection of design objects COLL-A 904A and a second collection of design objects COLL-B 904B. Those skilled in the art will recognize that although both the collections are provided on the same platform, it is not necessary that the collections co-exist on the computer platform 900. Accordingly, in other embodiments, one of the collections may be disposed remotely with respect to the other design object collection. A port compatibility engine 906 is operable with respect to the two design object collections 904A, 904B for generating a port compatible group 908 that includes a subset of the design objects common to both collections whose port lists are compatible as explained above. A compatibility engine 910 operates on the port compatibility group 908 that may be pruned as necessary, whereby a compatible design object set 914 is generated. A reduction engine 912 is provided for iteratively reducing the compatible design object set 914 to a reduced design object group 916 that contains a set of design objects whose Boolean values are indicative of whether they can be safely exchanged between the two collections 904A, 904B. It should be apparent to one skilled in the art that the various engines set forth herein as part of the system for providing interface compatibility between sets of design objects may be effectuated via hardware, software, firmware, or any combination thereof.

Although the invention has been particularly described with reference to certain illustrations, it is to be understood that the forms of the invention shown and described are to be treated as exemplary embodiments only. Various changes, substitutions and modifications can be realized without departing from the spirit and scope of the invention as defined by the appended claims.

What is claimed is:

1. A method for providing interface compatibility between two hierarchical collections of integrated circuit (IC) design objects, comprising:
   establishing an associative correspondence between a design object from a first hierarchical collection and a design object from a second hierarchical collection;
   generating a port compatibility map based on determination that a particular associative correspondence includes a pair of design objects, one from each hierarchical collection, that are port-compatible; and
   reducing said port compatibility map to determine a set of design object pairs that allow replaceability between said first and second hierarchical collections.

2. The method for providing interface compatibility between two hierarchical collections of IC design objects as recited in claim 1, wherein said operation of reducing said port compatibility map is performed iteratively.

3. The method for providing interface compatibility between two hierarchical collections of IC design objects as recited in claim 2, wherein said operation of reducing said port compatibility map further comprises:
   pruning design object entities of said port compatibility map based on determination that a specific design object at a particular hierarchical level is exchangeable between said first and second hierarchical collections regardless of whether any design objects respectively under said specific design objects are port-incompatible, thereby generating a compatibility group map derived from said port compatibility map;
   for each design object of said compatibility group map whose Boolean value is false, determining if a user design object thereof can be falsified, wherein said user design object is a parent design object in said compatibility group map whose Boolean value is true;
   if so, rendering said user design object's Boolean value to be false; and
   falsifying remaining design objects of said compatibility group map until all parent design objects therein are exhausted, thereby arriving at a set of design objects whose Boolean values indicate whether they can be replaced between said first and second hierarchical collections.

4. The method for providing interface compatibility between two hierarchical collections of IC design objects as recited in claim 3, wherein said determination that said pair of design objects are port-compatible is effectuated automatically by comparing signal names of said design objects.

5. The method for providing interface compatibility between two hierarchical collections of IC design objects as recited in claim 3, wherein said determination that said pair of design objects are port-compatible is effectuated by establishing semantic equivalency between said design objects.

6. The method for providing interface compatibility between two hierarchical collections of IC design objects as recited in claim 3, wherein said determination that said pair of design objects are port-compatible is effectuated comparing input/output (I/O) interfaces of said design objects.

7. The method for providing interface compatibility between two hierarchical collections of IC design objects as recited in claim 3, wherein said determination that said pair of design objects are port-compatible is effectuated manually.

8. The method for providing interface compatibility between two hierarchical collections of IC design objects as recited in claim 3, wherein said determination that said pair of design objects are port-compatible is effectuated by enforcing electrical design equivalency between said design objects.

9. A system for providing interface compatibility between two hierarchical collections of integrated circuit (IC) design objects, comprising:
   means for establishing an associative correspondence between a design object from a first hierarchical collection and a design object from a second hierarchical collection;
   means for generating a port compatibility map based on determination that a particular associative correspondence includes a pair of design objects, one from each hierarchical collection, that are port-compatible; and
   means for reducing said port compatibility map to determine a set of design object pairs that allow replaceability between said first and second hierarchical collections.

10. The system for providing interface compatibility between two hierarchical collections of IC design objects as recited in claim 9, wherein said means for reducing said port compatibility map is operable to perform iteratively.

11. The system for providing interface compatibility between two hierarchical collections of IC design objects as recited in claim 10, wherein said means for reducing said port compatibility map further comprises:
   means for pruning design object entities of said port compatibility map based on determination that a specific design object at a particular hierarchical level is exchangeable between said first and second hierarchical collections regardless of whether any design objects respectively under said specific design objects are port-incompatible, thereby generating a compatibility group map derived from said port compatibility map;
   means for determining, for each design object of said compatibility group map whose Boolean value is false, if a user design object thereof can be falsified, wherein said user design object is a parent design object in said compatibility group map whose Boolean value is true;
   means, responsive to said determination that a design object of said compatibility map can be falsified, for rendering said user design object's Boolean value to be false; and
   means for falsifying remaining design objects of said compatibility group map until all parent design objects therein are exhausted, thereby arriving at a set of design objects whose Boolean values indicate whether they can be replaced between said first and second hierarchical collections.

12. The system for providing interface compatibility between two hierarchical collections of IC design objects as recited in claim 11, wherein said determination that said pair of design objects are port-compatible is effectuated automatically by comparing signal names of said design objects.

13. The system for providing interface compatibility between two hierarchical collections of IC design objects as recited in claim 11, wherein said determination that said pair of design objects are port-compatible is effectuated by establishing semantic equivalency between said design objects.

14. The system for providing interface compatibility between two hierarchical collections of IC design objects as recited in claim 11, wherein said determination that said pair of design objects are port-compatible is effectuated comparing input/output (I/O) interfaces of said design objects.

15. The system for providing interface compatibility between two hierarchical collections of IC design objects as recited in claim 11, wherein said determination that said pair of design objects are port-compatible is effectuated manually.

16. The system for providing interface compatibility between two hierarchical collections of IC design objects as recited in claim 11, wherein said determination that said pair of design objects are port-compatible is effectuated by enforcing electrical design equivalency between said design objects.

17. A computer platform operable to support an integrated circuit (IC) chip design database environment, comprising:
   a first collection of design objects disposed in said IC chip design database environment;
   a second collection of design objects disposed in said IC chip design database environment;
   a port compatibility engine operating to generate a port-compatible group of design objects relative to said first and second collections of design objects;
   a compatibility engine for obtaining a compatible group of design objects based on said port-compatible group; and
   a reduction engine for iteratively reducing said compatibility group to a set of design objects that are replaceable between said first and second collections of design objects.

18. The computer platform operable to support an IC chip design database environment as recited in claim 17, wherein said first collection of design objects is hierarchically arranged.

19. The computer platform operable to support an IC chip design database environment as recited in claim 17, wherein said second collection of design objects is hierarchically arranged.

20. The computer platform operable to support an IC chip design database environment as recited in claim 17, wherein each of said first and second collections of design objects comprises a standard cell library portion.

21. A computer-accessible medium operable with a computer platform to support an integrated chip (IC) chip design database environment, the medium having stored thereon instructions for providing interface compatibility between two hierarchical collections of IC design objects, comprising:
   program code for establishing an associative correspondence between a design object from a first hierarchical collection and a design object from a second hierarchical collection;
   program code for generating a port compatibility map based on determination that a particular associative correspondence includes a pair of design objects, one from each hierarchical collection, that are port-compatible; and
   program code for reducing said port compatibility map to determine a set of design object pairs that allow replaceability between said first and second hierarchical collections.

22. The computer-accessible medium as recited in claim 21, wherein said program code for reducing said port compatibility map is operable to perform iteratively.

23. The computer-accessible medium as recited in claim 22, wherein said program code for reducing said port compatibility map further comprises:
   program code for pruning design object entities of said port compatibility map based on determination that a specific design object at a particular hierarchical level is exchangeable between said first and second hierarchical collections regardless of whether any design objects respectively under said specific design objects are port-incompatible, thereby generating a compatibility group map derived from said port compatibility map;
   program code for determining, for each design object of said compatibility group map whose Boolean value is false, if a user design object thereof can be falsified, wherein said user design object is a parent design object in said compatibility group map whose Boolean value is true;
   program code, responsive to said determination that a design object of said compatibility group map can be falsified, for rendering said user design object's Boolean value to be false; and
   program code for falsifying remaining design objects of said compatibility group map until all parent design objects therein are exhausted, thereby arriving at a set of design objects whose Boolean values indicate whether they can be replaced between said first and second hierarchical collections.

24. The computer-accessible medium as recited in claim 23, wherein said determination that said pair of design objects are port-compatible is effectuated automatically by comparing signal names of said design objects.

25. The computer-accessible medium as recited in claim 23, wherein said determination that said pair of design objects are port-compatible is effectuated by establishing semantic equivalency between said design objects.

26. The computer-accessible medium as recited in claim 23, wherein said determination that said pair of design objects are port-compatible is effectuated comparing input/output (I/O) interfaces of said design objects.

27. The computer-accessible medium as recited in claim 23, wherein said determination that said pair of design objects are port-compatible is effectuated manually.

28. The computer-accessible medium as recited in claim 23, wherein said determination that said pair of design objects are port-compatible is effectuated by enforcing electrical design equivalency between said design objects.

* * * * *